United States Patent
Papadopoulos et al.

(10) Patent No.: US 12,387,767 B2
(45) Date of Patent: Aug. 12, 2025

(54) METHOD AND APPARATUS FOR QUANTIZATION AND DEQUANTIZATION OF NEURAL NETWORK INPUT AND OUTPUT DATA USING PROCESSING-IN-MEMORY

(71) Applicant: Advanced Micro Devices, Inc., Santa Clara, CA (US)

(72) Inventors: Ioannis Papadopoulos, Boxorough, MA (US); Vignesh Adhinarayanan, Austin, TX (US); Ashwin Aji, Santa Clara, CA (US); Jagadish B Kotra, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 236 days.

(21) Appl. No.: 18/346,110

(22) Filed: Jun. 30, 2023

(65) Prior Publication Data

US 2025/0006232 A1 Jan. 2, 2025

(51) Int. Cl.
*G11C 7/10* (2006.01)
*G06F 3/06* (2006.01)

(52) U.S. Cl.
CPC .......... *G11C 7/1006* (2013.01); *G06F 3/0611* (2013.01); *G06F 3/0656* (2013.01); *G06F 3/0688* (2013.01)

(58) Field of Classification Search
CPC ..... G11C 7/1006; G11C 11/54; G06F 3/0611; G06F 3/0656; G06F 3/0688
USPC ......................................................... 365/189
See application file for complete search history.

(56) References Cited

U.S. PATENT DOCUMENTS

| | | | |
|---|---|---|---|
| 7,538,702 B2* | 5/2009 | Baker | G11C 16/26 341/142 |
| 2014/0258593 A1* | 9/2014 | Strauss | G11C 13/0004 365/45 |
| 2020/0226454 A1* | 7/2020 | Cambier | G06N 3/049 |
| 2022/0019441 A1* | 1/2022 | Rosing | G06N 3/084 |

* cited by examiner

*Primary Examiner* — Huan Hoang
*Assistant Examiner* — Minh Dinh
(74) *Attorney, Agent, or Firm* — Kowert, Hood, Munyon, Rankin & Goetzel, P.C.; Rory D. Rankin

(57) ABSTRACT

An apparatus and method for creating less computationally intensive nodes for a neural network. An integrated circuit includes a host processor and multiple memory channels, each with multiple memory array banks. Each of the memory array banks includes components of a processing-in-memory (PIM) accelerator and a scatter and gather circuit used to dynamically perform quantization operations and dequantization operations that offload these operations from the host processor. The host processor executes a data model that represents a neural network. The memory array banks store a single copy of a particular data value in a single precision. Therefore, the memory array banks avoid storing replications of the same data value with different precisions to be used by a neural network node. The memory array banks dynamically perform quantization operations and dequantization operations on one or more of the weight values, input data values, and activation output values of the neural network.

20 Claims, 8 Drawing Sheets

METHOD AND APPARATUS FOR QUANTIZATION AND DEQUANTIZATION OF NEURAL NETWORK INPUT AND OUTPUT DATA USING PROCESSING-IN-MEMORY

BACKGROUND

Description of the Relevant Art

Neural networks are used in a variety of applications in a variety of fields such as physics, chemistry, biology, engineering, social media, finance, and so on. Neural networks use one or more layers of nodes to classify data in order to provide an output value representing a prediction when given a set of inputs. Weight values are used to determine an amount of influence that a change in a particular input data value will have upon a particular output data value within the one or more layers of the neural network. The cost of using a trained neural network includes providing hardware resources that can process the relatively high number of computations and can support the data storage and the memory bandwidth for accessing parameters. The parameters include the input data values, the weight values, the bias values, and the activation values. If an organization cannot support the cost of using the trained neural network, then the organization is unable to benefit from the trained neural network.

In view of the above, efficient methods and apparatuses for creating less computationally intensive nodes for a neural network are desired.

Figure 1:
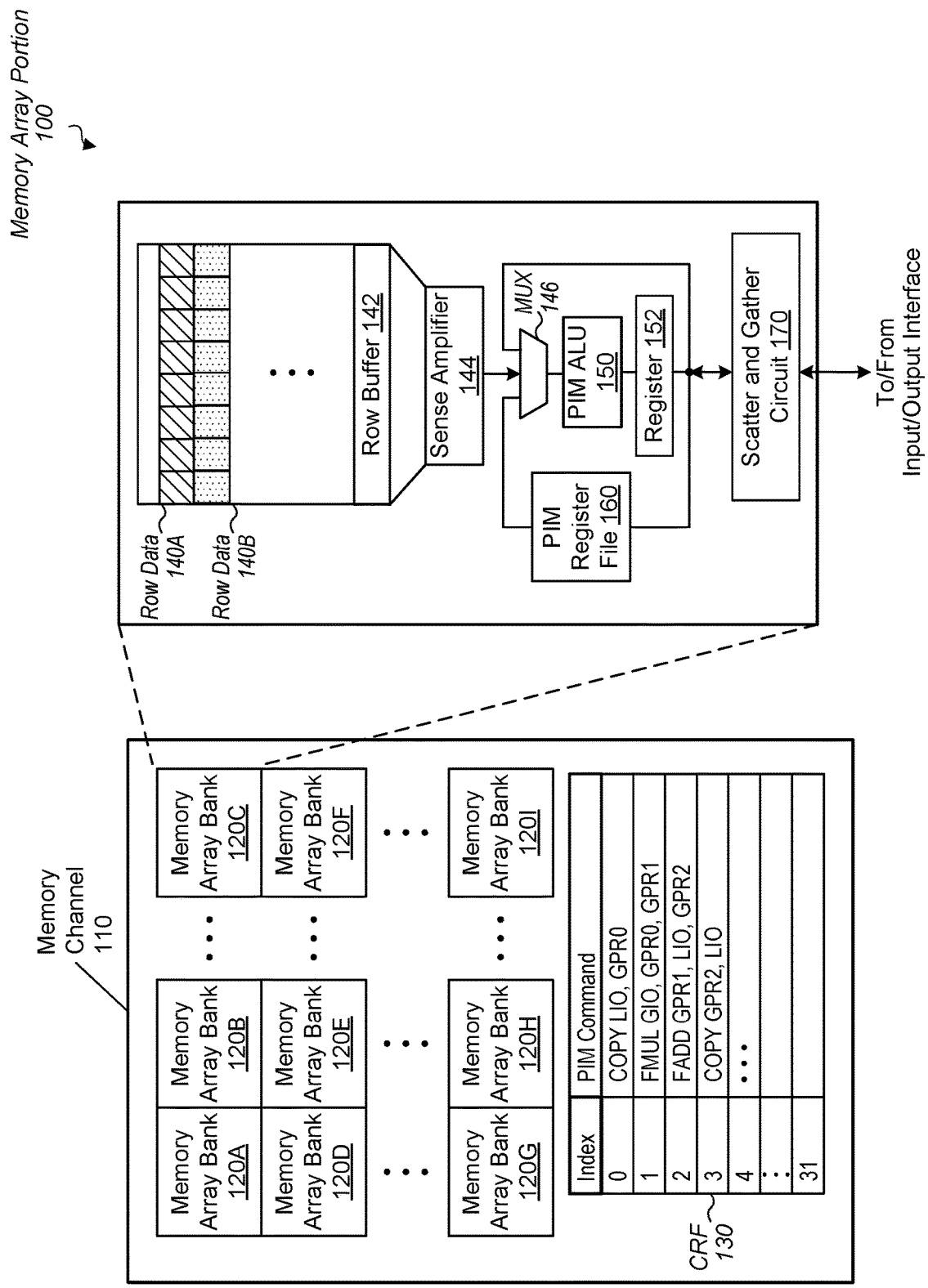
FIG. 1 is a generalized diagram of a memory array portion used in a memory array that creates less computationally intensive nodes for a neural network.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Apparatuses and methods that create less computationally intensive nodes for a neural network are contemplated. In various implementations, an integrated circuit includes a host processor and multiple memory channels, each with multiple memory array banks. Each of the memory array banks includes components of a processing-in-memory (PIM) accelerator and a scatter and gather circuit used to dynamically perform quantization operations and dequantization operations that offload these operations from the host processor. The host processor executes a data model that represents a neural network. The memory array banks store a single copy of a particular data value in a single precision. Therefore, the memory array banks avoid storing replications of the same data value with different precisions to be used by a neural network node. The memory array banks dynamically perform quantization operations and dequantization operations on one or more of the weight values, input data values, and activation output values of the neural network. The memory array banks reduce data transmission and data bandwidth on memory buses between the host processor and the multiple memory channels. Further details of these techniques that create less computationally intensive nodes for a neural network are provided in the following description of FIGS. 1-8.

Turning now to FIG. 1, a generalized diagram is shown of a memory array portion 100 used in a memory array that creates less computationally intensive nodes for a neural network. The memory array portion 100 includes a memory channel 110 that uses multiple memory array banks 120A-120I. In an implementation, the memory array portion 100 also includes a configuration register file (CRF) 130 that stores commands to be executed by a particular one of the memory array banks 120A-120I. Although a particular number of memory array banks 120A-120I are shown, the memory channel 110 includes any number of memory array banks based on design requirements in other implementations. The memory channel 110 is one of multiple memory channels provided to implement off-chip memory to be used as a system memory in a computing system. The circuitry of the components of the memory array bank 120C are shown, and in various implementations, the other ones of the memory array banks 120A-120B and 120D-120I include the same circuitry and functionality.

The memory array bank 120C includes data storage of multiple rows of data such as at least row data 140A-140B. In various implementations, the memory array banks 120A-120I provide data storage of one of a variety of types of dynamic random-access memory (DRAM). The data storage of the row data 140A-140B includes a type of dynamic random-access memory that stores each bit of data in a separate capacitor within an integrated circuit. The capacitor can be either charged or discharged. These two states are used to represent the two logical values (Boolean values) of a bit (binary digit). The memory array bank 120C utilizes a single transistor and a capacitor per bit, which provides higher data storage density than the typical six transistor (6T) memory cells of on-chip synchronous RAM (SRAM).

Unlike hard disk drivers (HDDs) and flash memory, the memory array bank 120C can be volatile memory, rather than non-volatile memory. The memory array bank 120C can lose its data quickly when power is removed.

The memory array bank 120C includes a respective row buffer 142 of multiple row buffers of the memory array banks 120A-120I. The row buffer 142 stores data in an accessed row of the multiple rows within the memory array bank 120C. The accessed row is identified by a DRAM address in a received memory access request. Control circuitry of the memory array bank 120C synchronizes the accesses of an identified row and the row buffer 142 to change multiple DRAM transactions into a single, complex transaction. This single, complex transaction performs an activation operation and a pre-charge operation of data lines and control lines within the memory array bank 120C once to access an identified row and store the corresponding data in the row buffer 142. The sense amplifiers 144 are used for these operations. These operations are performed again once to put back modified contents stored in the row buffer 142 to the identified row.

The memory array bank 120C utilizes components of a processing-in-memory (PIM) accelerator. These components include at least the PIM arithmetic logic unit (ALU) 150 and the PIM register file 160. The components of the PIM accelerator integrate data processing capability with data storage within a same memory device. The PIM ALU 150 performs a variety of operations based on a received command such as the commands stored in the CRF 130. The PIM register file 160 stores source operands, destination operands or result operands, and intermediate data values. The register 152 stores data to be read from the memory array bank 120C or written to the memory array bank 120C. The register 152 can also be used as an accumulation register.

The scatter and gather circuit 170 (or circuit 170) is configured to expand or distribute ("scatter") multiple data items to non-contiguous memory locations and compact ("gather") multiple data items from non-contiguous memory locations into contiguous memory locations ("gather"). multiple data the data storage of quantized data values compared to the original dequantized data values. For example, the circuit 170 expands dequantized versions of original quantized data values. Further details of the compaction operation, the expansion operation, and resulting data values from the quantization operation and the dequantization operation are provided in the upcoming description of the data storage arrangement 200 (of FIG. 2). The PIM ALU 150 receives input data values from the row buffer 142, the PIM register file 160, and the circuit 170. The multiplexer (or mux) 146 selects which source to use for input data values based on a particular operation of a command received from the CRF 130. The data storage functionality of the CRF 130 can be implemented using one of flip-flop circuits, one of a variety of types of a synchronous RAM (SRAM), a content addressable memory (CAM), and so forth. The actual command types shown as well as the indications of the source operand registers and destination operand registers are for illustrative purposes only. A variety of other command types and indications of operand registers are possible and contemplated.

In various implementations, the PIM ALU 150 is capable of performing quantization operations and dequantization operations dynamically, which offloads an external processor from performing these operations. Therefore, it is unnecessary to have an external general-purpose central processing unit (CPU), an external processor with a highly parallel data microarchitecture such as a graphics processing unit (GPU), or another type of external processor perform the quantization operations and dequantization operations. By having a workload that includes the quantization operations and dequantization operations offloaded from them, these external processors are allowed to process other types of workloads without further delay.

With each of the memory array banks 120A-120I using the PIM ALU 150 and the circuit 170, the memory array banks 120A-120I support storing a single copy of a data value in a single precision, such as its original precision, in the memory channel 110. With the PIM ALU 150 and the circuit 170, the memory array bank 120C (and the memory array banks 120A-120B and 120D-120I) avoids storing replications of the same data value with different precisions in the memory channel 110. As used herein, the term "precision" is used to refer to a data size, such as a bit width or number of bits, used to represent a magnitude of a particular data value. Precisions are used to provide a higher or lower accuracy of a same magnitude of a particular data value. When a first magnitude of the particular data value is represented by 32 bits, the accuracy and precision of the first magnitude is higher than a second magnitude of the particular data value represented by 8 bits.

By reducing the number of replications of a particular data value to a single copy, the memory array banks 120A-120I significantly reduce data transmission and data bandwidth on memory buses between the memory array portion 100 and external processors. This reduction of data transmission and data bandwidth on memory buses reduces both power consumption and latency during training steps and inference steps of a corresponding neural network. When the PIM ALU 150 performs a quantization operation, the PIM ALU 150 replaces a first magnitude of a first data value using a first precision with a second magnitude of the first data value using a second precision less than the first precision.

In one implementation, the memory array bank 120C stores a single copy of a first data value having a first magnitude of 15.387 using a first precision of a 32-bit floating-point data format. In an implementation, the memory array bank 120C stores the first data value using the precision of the 32-bit IEEE-754 single-precision floating-point data format. The PIM ALU 150 performs a quantization operation by replacing the first magnitude of the first data value with a second magnitude of 15 of the first data value using a second precision less than the first precision. The second precision can be the precision of the 16-bit bfloat16 data format, the 8-bit fixed-point int8 integer data format, or another lower precision. In an implementation, the second precision is an 8-bit fixed-point data format.

The PIM ALU 150 uses one of a variety of types of quantization algorithms. Some of these quantization algorithms use an asymmetric mode. To perform quantization using the asymmetric mode, which provides a lower precision than the original first precision, the PIM ALU 150 utilizes a scaling factor value and a zero-point value. These values are stored in configuration registers (not shown). The asymmetric mode is also referred to as uniform affine quantization. In the asymmetric mode, the quantization algorithm maps the minimum and maximum values of a first range of values represented by a first, higher precision (such as a 32-bit floating-point data format) to the minimum and maximum values of a second range of values represented by a second, lower precision (such as the 8-bit fixed-point int8 integer data format). To do so, a zero-point value maps the zero value between the minimum and maximum values of the first range to a non-zero value between the minimum and maximum values of the second range. The zero-point value is also referred to as a quantization bias or a quantization offset. Accordingly, each of the scale factor and the zero-point value is used to map values in the first range to values in the second range. The scale factor specifies the step-size of the quantization algorithm. The zero-point is a value in the second range that ensures that a zero value is quantized without error such that a zero padding operation or a rectified linear unit (ReLU) activation function does not induce quantization error.

When a quantization algorithm uses a symmetric mode, the quantization algorithm maps the zero value of the first range to the zero value of the second range. In such a case, the zero-point value is not used. Each of the first range and the second range is already symmetric with respect to a corresponding zero value. When the data values stored in the memory array bank 120C are used by a neural network, the memory array bank 120C stores a corresponding pair of a scaling factor value and a zero-point value for each of the types of data values. Examples of the types are weight values, input data values, and activation output values. In some implementations, the sequence of steps performed by the quantization operation and the dequantization operation by the memory array bank 120C is programmable and even includes a truncation operation.

In an implementation, the first data value having the second magnitude of 15 using the second precision provided by the 8-bit fixed-point data format is used in an integer matrix multiply and accumulate (MAC) operation of a neural network. In other implementations, the PIM ALU 150 performs a quantization operation by replacing the first magnitude of 15.387 of the first data value using the first precision of a 32-bit floating-point data format with a third magnitude of 15.4 using a third precision of a 16-bit floating-point data format. Therefore, the PIM ALU 150 performs a quantization operation by replacing the magnitude of a particular data value using a new precision that has less precision than the original precision, but more precision than a precision that uses a fixed-point data format.

When the PIM ALU 150 performs the quantization operation, the requester that receives the resulting data value uses smaller data values that use less bit widths than the data values stored in the memory array bank 120C. The PIM ALU 150 performs a dequantization operation by performing a reverse of the steps of the quantization operation. For example, the PIM ALU 150 performs a dequantization operation by increasing the precision (increasing the bit width) of the magnitude used to represent a particular data value.

In some implementations, one or more requesters that request access to data stored in the memory channel 110 are processors that provide the functionality of a neural network. A neural network is a data model that implements one of a variety of types of a multilayer network that classifies data in order to provide output data that represents a prediction when given a set of inputs. Examples of the neural network are one of multiple types of convolutional neural networks and recurrent neural networks. The neural network uses weight values, input data values, output data values, and activation data values used between layers of the neural network. One or more of these data values are stored in the memory array portion 100 of a larger memory that includes multiple memory array portions.

In some implementations, the larger memory that uses the memory array portion 100 includes multiple memory modules with each having a same protocol for a respective interface to an external memory controller. One example of a protocol is a double data rate (DDR) type of protocol. The protocol determines values used for information transfer, such as a number of data transfers per clock cycle, signal voltage levels, signal timings, signal and clock phases and clock frequencies. Protocol examples include DDR2 SDRAM, DDR3 SDRAM, GDDR4 (Graphics Double Data Rate, version 4) SDRAM, GDDR5 (Graphics Double Data Rate, version 5) SDRAM, GDDR5X (Graphics Double Data Rate, version 5x) SDRAM, and GDDR6 (Graphics Double Data Rate, version 6) SDRAM.

In an implementation, the larger memory that uses the memory array portion 100 utilizes a multi-channel memory architecture. This type of architecture increases the transfer speed of data between the memory array portion 100 and the memory controller by adding more channels of communication between them. The multi-channel architecture utilizes multiple memory modules and a motherboard and/or a card capable of supporting multiple channels. In an implementation, the memory channel 110 is a pseudo channel utilized when the memory array portion 100 supports a pseudo channel mode that is also supported by the GDDR5X and GDDR6 protocols. Although not shown, in an implementation, the memory array portion 100 utilizes three-dimensional integrated circuits (3D ICs) to further reduce memory latencies. It is noted that although the terms "left," "right," "horizontal," "vertical," "row," "column," "top," and "bottom" are used to describe the memory array portion 100, the meaning of the terms can change as the memory array portion 100 is rotated or flipped.

Figure 2:
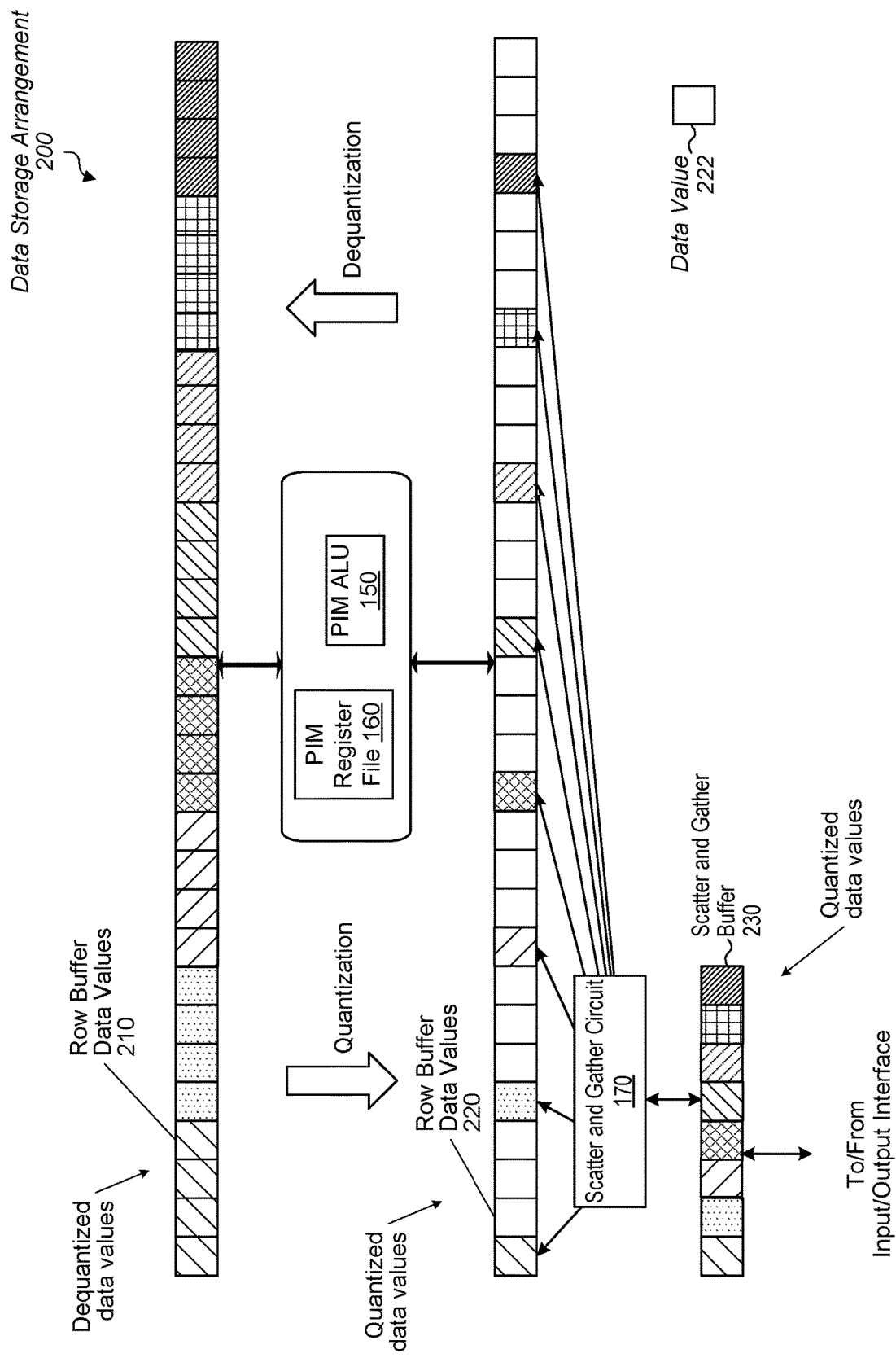
FIG. 2 is a generalized diagram of a data storage arrangement that creates less computationally intensive nodes for a neural network.

Referring to FIG. 2, a generalized diagram is shown of a data storage arrangement 200 that creates less computationally intensive nodes for a neural network. Circuits described earlier are numbered identically. The data storage arrangement 200 includes the row buffer data values 210, which are dequantized data values, and the row buffer data values 220, which are quantized data values. The scatter and gather buffer 230 (or buffer 230) stores quantized data values. The scatter and gather circuit 170 accesses the buffer 230. In an implementation, each of the row buffer data values 210 and 220 has a size of 32 bytes (32B), and the buffer 230 has a size of 8 bytes (8B). In such an implementation, each of the blocks with a corresponding fill pattern represents a byte of data. However, in other implementations, other data sizes are used based on design requirements.

The row buffer data values 210 represent dequantized data values read from a memory array bank, such as a DRAM bank, which are to be sent to one of the PIM register file 160 or a requester via a memory bus. The row buffer data values 210 can also represent data received from a requester via a memory bus to be sent to one of the memory array bank or the PIM register file 160. The row buffer data values 220 can represent quantized data values corresponding to the row buffer data values 210. In an implementation, the row buffer data values 210 include eight 4-byte (32-bit) data values. For each of the 4B data values of the row buffer data values 210, the row buffer data values 220 include a single updated byte. In such an implementation, the row buffer data values 210 includes eight 32-bit floating-point input data values, and the row buffer data values 220 includes an 8-bit fixed-point input data value for each one of the eight 32-bit floating-point input data values. The eight single byte fixed-point input data values of the row buffer data values 220 can be used in an integer matrix multiply and accumulate (MAC) operation of a corresponding neuron of a neural network. The unchanged data values 222 represent data values that have not been quantized, and thus remain unchanged from corresponding values of the row buffer data values 210 when a read access operation is performed of a row buffer of the memory array bank.

The data storage arrangement 200 represents dynamic quantization and dequantization operations that are performed by a PIM accelerator, such as the PIM ALU 150, of a memory array bank, rather than by a requester that accesses data values stored in the memory array bank. In addition, the memory array banks store a single copy of a particular data value in a single precision. Therefore, the memory array banks avoid storing replications of the same data value with different precisions to be used by a neural network node. The components of a PIM accelerator operate on data to be read from or written to the row buffer of a corresponding memory array bank. For a read access of the row buffer, the dequantized data values of the row buffer data values 210 are quantized by the PIM ALU 150 to provide the row buffer data values 220. In an implementation, each of the shaded blocks of the row buffer data values 220 represents a single byte fixed-point input data value corresponding to one of the eight 32-bit floating-point input data values of the dequantized data values of the row buffer data values 210.

During a quantized load operation, once the dequantized data values of the row buffer data values 210 have been quantized by the PIM ALU 150, the scatter and gather circuit 170 (or circuit 170) compacts the row buffer data values 220 into the buffer 230. The circuit 170 performs a gather operation by compacting the row buffer data values 220 into the buffer 230 (e.g., into contiguous locations). Afterward, the data values stored in the buffer 230 are sent to one of the registers of the PIM register file 160. For a quantized read operation, the steps are the same until the circuit 170 compacts the row buffer data values 220 into the buffer 230. Afterward, the data values stored in the buffer 230 are sent to a requester via a memory bus. In various implementations, compacting the data values enables transmission of the multiple data values in a single (or fewer) memory bus transactions than would otherwise be required.

During a dequantized write operation, quantized data values are received, via the memory bus, from a requester. The circuit 170 expands the quantized data values from the buffer 230 to non-contiguous locations of the row buffer. The circuit 170 performs a scatter operation by expanding the quantized data values from the buffer 230 to non-contiguous locations of the row buffer. The circuit 170 initiates the scatter operation by storing the received quantized data values in the buffer 230. The PIM ALU 150 continues the scatter operation by dequantizing these quantized data values and storing the resulting dequantized data values in a row buffer. In another implementation, the circuit 170 stores the resulting dequantized data values in a row buffer. The non-contiguous locations can be the start byte locations of dequantized data values stored in the row buffer. In an implementation, the circuit 170 stores the quantized data values in locations of the row buffer corresponding to the start locations of corresponding dequantized data values. Afterward, the PIM ALU 150 reads these quantized data values from the row buffer and generates the corresponding dequantized data values to store in the row buffer. In another implementations, the PIM ALU 150 reads these quantized data values from the buffer 230 and generates the corresponding dequantized data values to store as the row buffer data values 210 in the row buffer.

It is noted that a difference between the quantized load operation and the quantized read operation is the destination of the results. The source being the row buffer is the same for these operations. However, for the quantized load operation, the destination is the PIM register file 160. For the quantized read operation, the destination is the requester via the memory bus and a corresponding memory controller. For another type of read access operation, such as a dequantized read operation, the source is the row buffer, and the destination is the requester via the memory bus and a corresponding memory controller. For a dequantized load operation, the source is the PIM register file 160, and the destination is the requester via the memory bus and a corresponding memory controller. For a write access operation, such as a dequantized store operation, the source is the PIM register file 160, and the destination is the row buffer. For a dequantized write operation, the source is the requester via the memory bus and a corresponding memory controller, and the destination is the row buffer.

Figure 3:
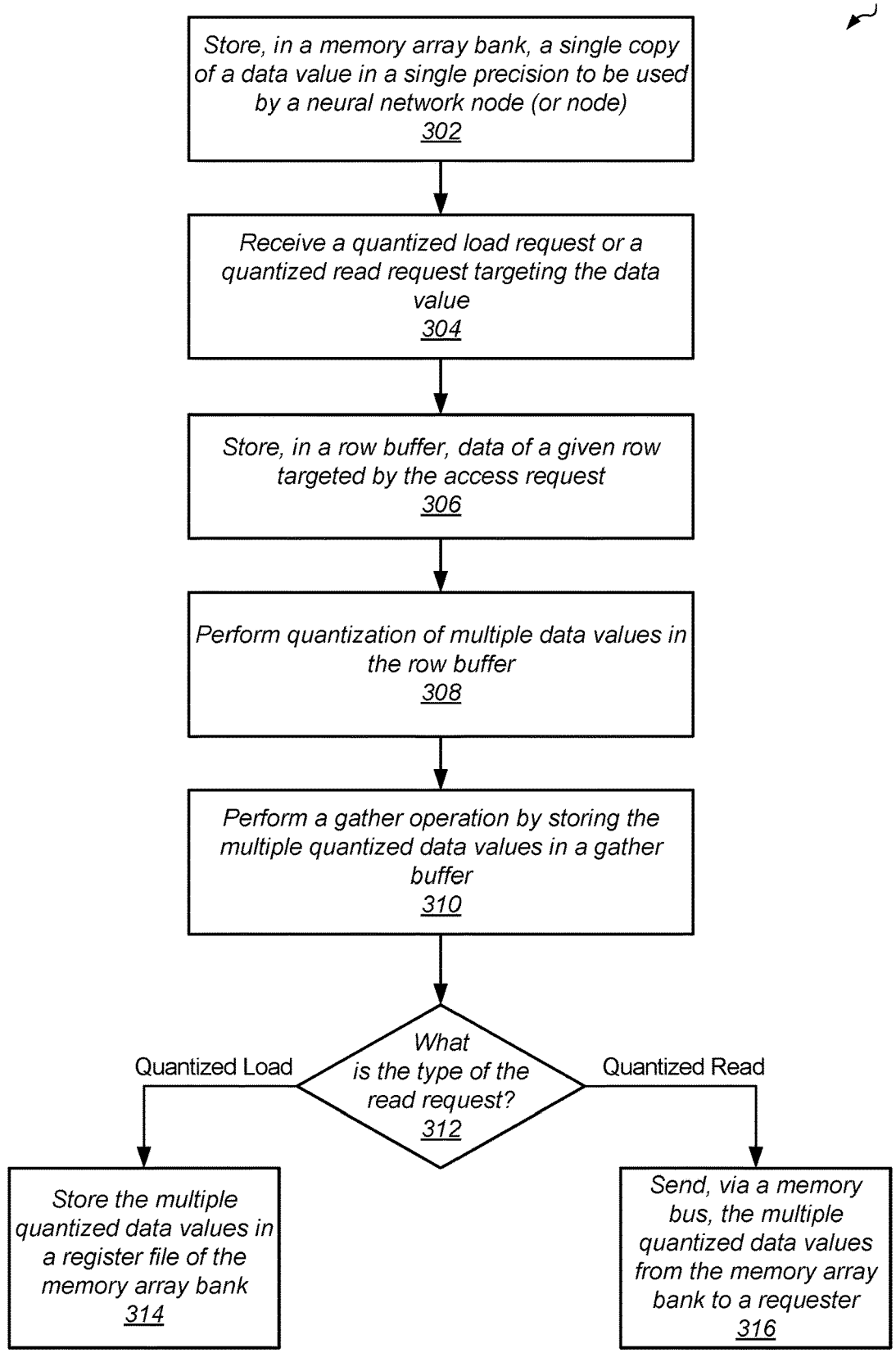
FIG. 3 is a generalized diagram of a method that creates less computationally intensive nodes for a neural network.

Referring to FIG. 3, a generalized diagram is shown of a method 300 that creates less computationally intensive nodes for a neural network. For purposes of discussion, the steps in this implementation (as well as in FIGS. 4-6) are shown in sequential order. However, in other implementations some steps occur in a different order than shown, some steps are performed concurrently, some steps are combined with other steps, and some steps are absent.

A memory array bank stores a single copy of a data value in a single precision to be used by a neural network node (or node) (block 302). Circuitry of the memory array bank receives a quantized load request or a quantized read request targeting the data value (block 304). The circuitry stores, in a row buffer, data of a given row targeted by the access request (block 306). The circuitry performs quantization of multiple data values stored in the row buffer (block 308). In some implementations, the given row includes multiple data values, each being a separate data value with a representation using a first precision. The circuitry includes PIM ALUs that read the multiple data values from the row buffer and performs a quantization operation on each of the multiple data values by replacing the magnitudes of the multiple data values. Each of the multiple quantized data values is represented value with a representation using a second precision less than the first precision. In an implementation, the first precision is a 32-bit floating-point data format, and the second precision is an 8-bit fixed-point data format. In an implementation, the PIM ALUs write the multiple quantized data values in the row buffer.

The circuitry performs the gather operation by retrieving the multiple quantized data values and storing the multiple quantized data values in a gather buffer (block 310). If the type of the request is a quantized load request ("Quantized Load" branch of the conditional block 312), then the circuitry stores the multiple quantized data values in a register file of the memory array bank (block 314). If the type of the request is a quantized read request ("Quantized Read" branch of the conditional block 312), then the circuitry sends, via a memory bus, the multiple quantized data values from the memory array bank to a requester (block 316).

Figure 4:
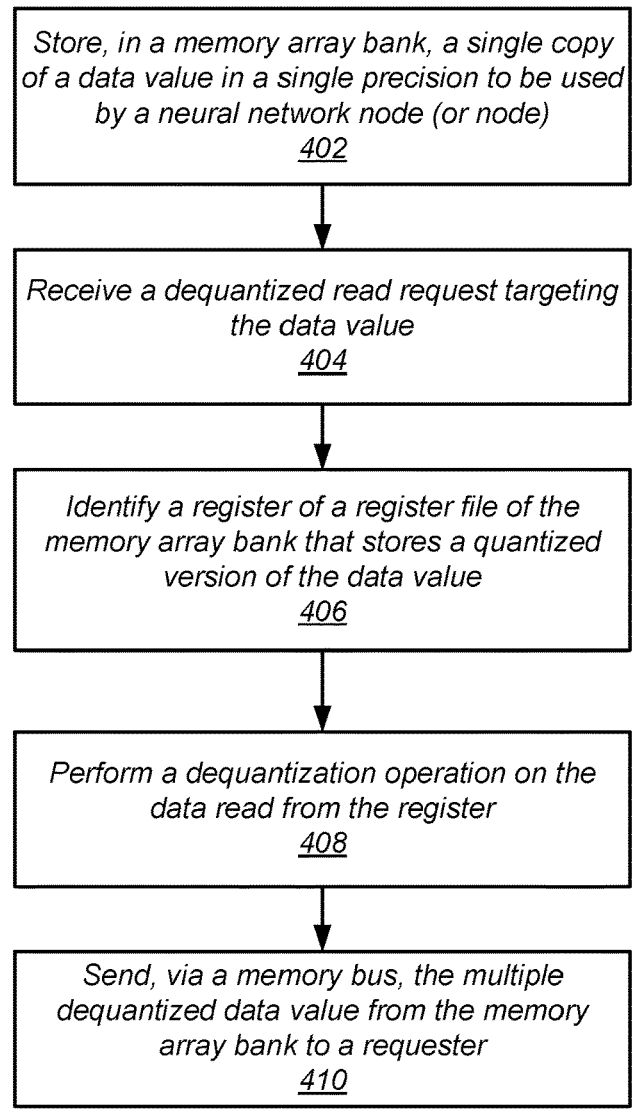
FIG. 4 is a generalized diagram of a method that creates less computationally intensive nodes for a neural network.

Turning now to FIG. 4, a generalized diagram is shown of a method 400 that creates less computationally intensive nodes for a neural network. A memory array bank stores a single copy of a data value in a single precision to be used by a neural network node (or node) (block 402). Circuitry of the memory array bank receives a dequantized read request targeting the data value (block 404). The circuitry identifies a register of a register file of the memory array bank that stores a quantized version of the data value (block 406). The circuitry performs a dequantization operation on the data read from the register (block 408). The circuitry sends, via a memory bus, the multiple dequantized data value from the memory array bank to a requester (block 410).

Figure 5:
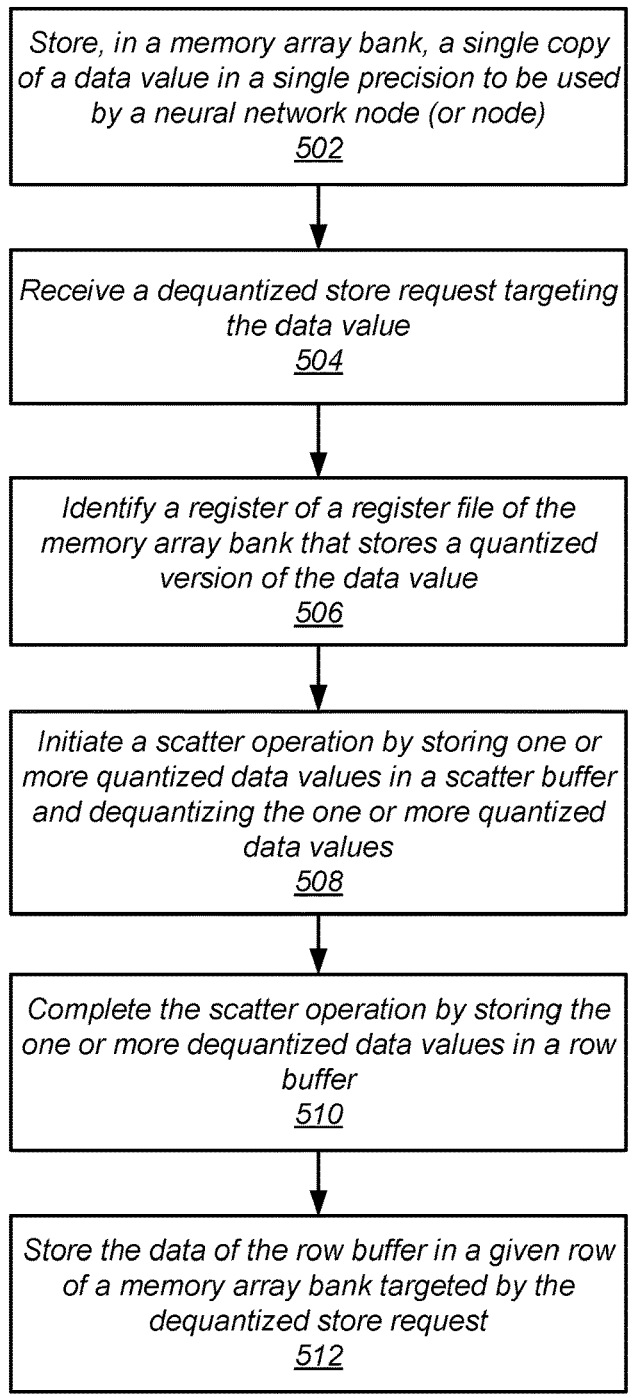
FIG. 5 is a generalized diagram of a method that creates less computationally intensive nodes for a neural network.

Referring to FIG. 5, a generalized diagram is shown of a method 500 that creates less computationally intensive nodes for a neural network. A memory array bank stores a single copy of a data value in a single precision to be used by a neural network node (or node) (block 502). In other words, the memory array bank has a single data storage area allocated for storing a copy of the data value. No other data storage area is allocated for storing a copy of the data value in the memory array bank. When a later write access operation targeting the data value is performed, the same single data storage area is updated. No other data storage area of the memory array bank is allocated for storing a separate copy of an updated value of the data value. Circuitry of the memory array bank receives a dequantized store request targeting the data value (block 504). The circuitry identifies a register of a register file of the memory array bank that stores a quantized version of the data value (block 506). The circuitry initiates a scatter operation by storing one or more quantized data values in a scatter buffer and dequantizing the one or more quantized data values (block 508). The circuitry completes the scatter operation by storing the one or more dequantized data values in a row buffer (block 510). The circuitry stores the data of the row buffer in a given row of a memory array bank targeted by the dequantized store request (block 512).

Figure 6:
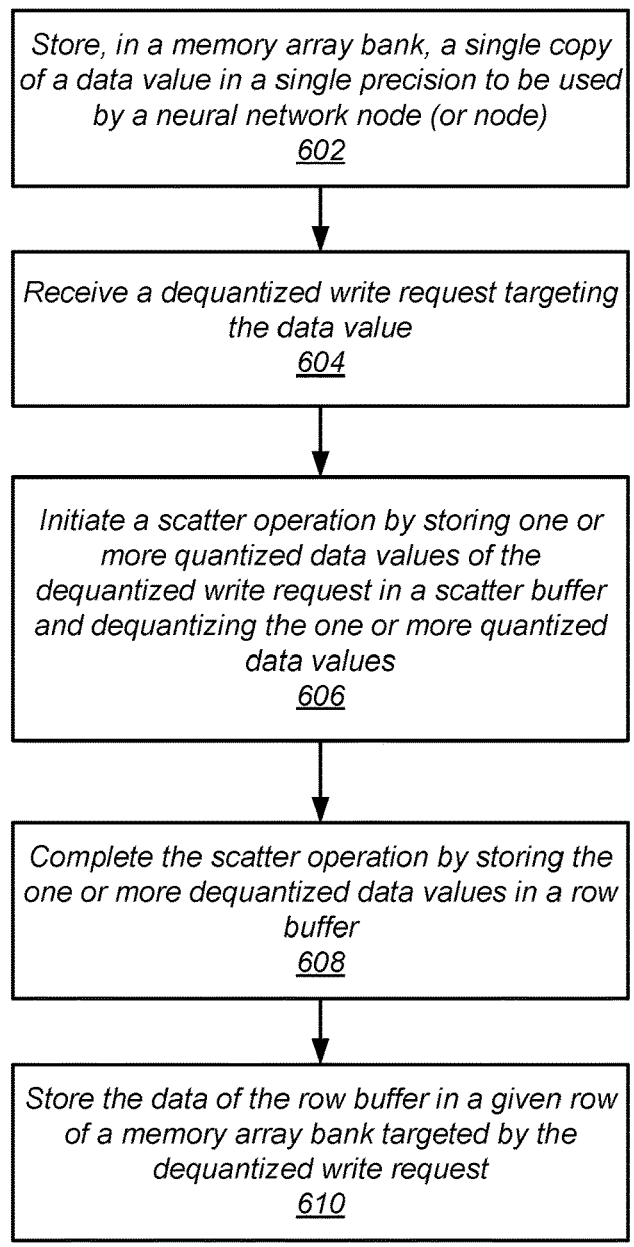
FIG. 6 is a generalized diagram of a method that creates less computationally intensive nodes for a neural network.

Turning now to FIG. 6, a generalized diagram is shown of a method 600 that creates less computationally intensive nodes for a neural network. A memory array bank stores a single copy of a data value in a single precision to be used by a neural network node (or node) (block 602). As described earlier, the memory array bank has a single data storage area allocated for storing a copy of the data value. No other data storage area is allocated for storing a copy of the data value in the memory array bank. When a later write access operation targeting the data value is performed, the same single data storage area is updated. Circuitry of the memory array bank receives a dequantized write request targeting the data value (block 604). In various implementations, the dequantized write request is received from a particular requester of one or more requesters that request access to data stored in the memory array bank. The circuitry initiates a scatter operation by storing one or more quantized data values of the dequantized write request in a scatter buffer and dequantizing the one or more quantized data values (block 606). The circuitry completes the scatter operation by storing the one or more dequantized data values in a row buffer (block 608). The circuitry stores the data of the row buffer in a given row of a memory array bank targeted by the dequantized write request (block 610).

Figure 7:
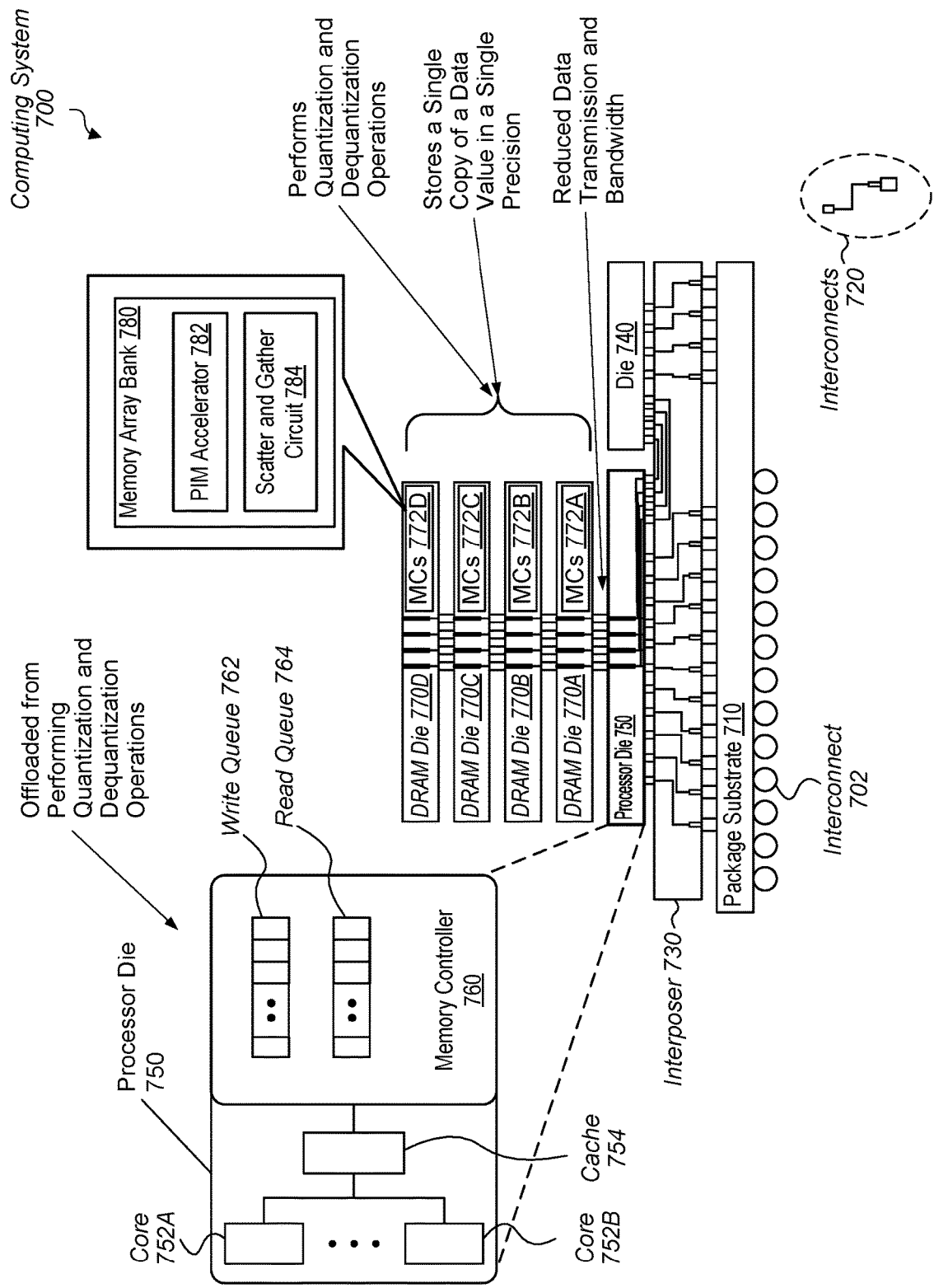
FIG. 7 is a generalized diagram of a computing system that creates less computationally intensive nodes for a neural network.

Turning now to FIG. 7, a generalized diagram is shown of a computing system 700 that creates less computationally intensive nodes for a neural network. The computing system 700 utilizes three-dimensional (3D) packaging. This type of packaging can be referred to as a System in Package (SiP). A SiP includes one or more three-dimensional integrated circuits (3D ICs). A 3D IC includes two or more layers of active electronic components integrated both vertically and/or horizontally into a single integrated circuit. In the illustrated implementation, the computing system 700 includes the processor die 750, the die 740, and multiple three-dimensional (3D) DRAM dies 770A-770D. The DRAM dies 770A-770D provide a high bandwidth memory (HBM) for the processor die 750 and the die 740. Each of the DRAM dies 770A-770D includes respective, multiple memory channels (MCs) 772A-772D. Although a particular number of components is shown in the computing system 700, it is possible and contemplated that the number and types of components change in other implementations as based on design requirements.

In various implementations, each of the MCs 772A, 772B, 772C and 772D includes the functionality of the memory channel 110 (of FIG. 1). Therefore, each of the DRAM dies 770A-770D is capable of storing a single copy of a data value in a single precision. In some implementations, the single copy of the data value in the single precision is used by a neural network node. Each of the MCs 772A-772D includes one or more memory array banks (or DRAM banks) that has a PIM accelerator capable of performing quantization operations and dequantization operations dynamically, which offloads the processor die 750 and any other processor die from performing these operations. As shown, the memory channel 772D includes the memory array banks 780, which have the same functionality as the memory array banks 120A-120I (of FIG. 1). As shown, the memory channel 772D also includes the PIM accelerator 782 that includes components such as a PIM register file and a PIM ALU, which have the same functionality as the PIM register file 160 and a PIM ALU 150 (of FIG. 1). The memory channel 772D also includes the scatter and gather circuit 784, which has the same functionality as the circuit 170 (of FIG. 1). In various implementations, the memory channels 772A-772C are instantiated copies of the circuitry of the memory channel 772D. Although In various implementations, interposer-based integration can be used whereby the die 740 can be placed next to the processor die 750, and the DRAM dies 770A-770D are stacked directly on top of one another and on top of the processor die 750. Die-stacking technology is a fabrication process that enables the physical stacking of multiple separate pieces of silicon (integrated chips) together in a same package with high-bandwidth and low-latency interconnects. The processor die 750 and the die 740 are stacked side by side on a silicon interposer 730 (or interposer 730). Generally speaking, the interposer 730 is an intermediate layer between the dies 740 and 750 and either flip chip bumps or other interconnects and the package substrate 710. The interposer 730 can be manufactured using silicon or organic materials. Dielectric material, such as silicon dioxide, is also used between adjacent metal layers and within metal layers to provide electrical insulation between signal routes.

The package substrate 710 is a part of the semiconductor chip package that provides mechanical base support as well as provides an electrical interface for the signal interconnects for both dies within the computing system 700 and external devices on a printed circuit board. The package substrate 710 uses ceramic materials such as alumina, aluminum nitride, and silicon carbide. The package substrate 710 utilizes the interconnect 702, which includes controlled collapse chip connection (C4) interconnections. The interconnect 702 is also referred to as flip-chip interconnection.

The C4 bumps of the interconnect 702 are connected to the interconnects 720. The interconnects 720 include a combination of one or more of bump pads, vertical through silicon vias (TSVs), through-bulk silicon vias, backside vias, horizontal low-latency metal signal routes, and so forth. The size and density of the vertical interconnects and horizontal interconnects that can tunnel through the package substrate 710, the interposer 730, and the dies 740, 750 and 770A-770D varies based on the underlying technology used to fabricate the 3D ICs. The vertical interconnects of the interconnects 720 can provide multiple, large channels for signal routes, which reduces the power consumed to drive signals, minimizes the resistance and capacitance effects on signal routes, and reduces the distances of signal interconnects between the package substrate 710, the interposer 730, and the dies 740, 750 and 770A-770D.

Similar to the vertical low-latency interconnects, the in-package horizontal low-latency interconnects of the interconnects 720 provide reduced lengths of interconnect signals versus long off-chip interconnects when a SiP is not used. The in-package horizontal low-latency interconnects use particular signals and protocols as if the chips, such as the dies 740, 750 and 770A-770D were mounted in separate packages on a circuit board. The SiP of the computing system 700 can additionally include backside vias or through-bulk silicon vias that reach to package external connections used for input/output (I/O) signals and power signals. It is noted that although the terms "left," "right," "horizontal," "vertical," "row," "column," "top," and "bottom" are used to describe the computing system 700, the meaning of the terms can change as the computing system 700 is rotated or flipped.

As shown, the processor die 750 includes at least one or more processor cores 752A-752B (or cores 752A-752B), a cache 754, and a memory controller 760. The processor die 750 can include the functionality of one of a general-purpose central processing unit (CPU), a processor with a highly parallel data microarchitecture such as a graphics processing unit (GPU), an accelerated processing unit (APU), a field programmable gate array (FPGA), an application specific integrated circuit (ASIC), or other. Each of the cores 752A-752B is a requester capable of generating memory access requests for data stored on the DRAM dies 770A-770D. In an implementation, the cache 754 is a last-level cache of a hierarchical cache memory subsystem of the processor die 750. When requested data is not found in the cache memory subsystem, the memory access request is sent to the memory controller 760.

The memory controller 760 includes a write queue 762 for storing write access requests targeting data stored in one of the DRAM dies 770A, 770B, 770C and 770D, and the read queue 764 for storing read access requests targeting data stored in one of the DRAM dies 770A-770D. Additionally, the memory controller 760 includes queues for storing responses such as read response data and write acknowledgment responses. The memory controller 760 also includes control circuitry (not shown) for arbitrating between the write queue 762 and the read queue 764, and circuitry supporting a communication protocol for an interface circuit that communicates with the DRAM dies 770A-770D. As described earlier, the protocol determines values used for information transfer, such as a number of data transfers per clock cycle, signal voltage levels, signal timings, signal and clock phases and clock frequencies. Protocol examples include DDR2 SDRAM, DDR3 SDRAM, GDDR4 (Graphics Double Data Rate, version 4) SDRAM, and GDDR5 (Graphics Double Data Rate, version 5) SDRAM.

In various implementations, the DRAM dies 770A-770D are used to provide a row-based memory to use as a system memory for the computing system 700. In some implementations, the computing system 700 is used by a server that interacts with an external client device with a client-server architectural model. Examples of the client device are a laptop computer, a smartphone, a tablet computer, a desktop computer, or otherwise. In some implementations, each of the computing system 700 and the client device includes a network interface (not shown) supporting one or more communication protocols for data and message transfers through a network. The network interface supports at least the Hypertext Transfer Protocol (HTTP) for communication across the World Wide Web.

The external client device utilizes an online business, such as application running on the computing system 700, through the network, and the application includes a neural network application programming interface (API) that accesses multiple characterizing parameters. Examples of these parameters are a number of input data values in the values to send to an input layer of the neural network, an identifier specifying which set of weight values to use for the neural network, a number of hidden layers for the neural network, a number of nodes or neurons for each of the hidden layers, an indication of an activation function to use in each of the hidden layers, and so on.

As described earlier, the memory channels 772A-772D include one or more memory array banks (or DRAM banks), such as the memory array bank 780, with each memory array bank including a PIM accelerator 782 and the circuit 784. The PIM accelerator 782 is capable of performing quantization operations and dequantization operations dynamically, which offloads the processor die 750 and any other processor die from performing these operations. The memory channels 772A-772D support having a single copy of a data value in a single precision, such as its original precision, and avoids storing replications of the same data value with different precisions in the DRAM dies 770A-770D. The memory channels 772A-772D also significantly reduce data transmission and data bandwidth on memory buses between the processor die 750 and the DRAM dies 770A-770D, which reduces both power consumption and latency during training steps and inference steps of a corresponding neural network.

In some implementations, the memory channels 772A-772D store weight values, bias values, and input data values for a neural network with a data model executed by the processor die 750, the die 740, or another processor die. In an implementation, the memory channels 772A-772D store a single copy of these data values in a single precision such as the precision of the 32-bit IEEE-754 single-precision floating-point data format. The memory array bank 780 is able to reduce (lower) this precision to the precision of the 16-bit bfloat16 data format, the 8-bit fixed-point int8 integer data format, or another lower precision. A quantized neural network uses one or more quantized data values represented in the lower precision based on the weight values, bias values, and input data values represented in the original, higher precision. Computing systems, such as the computing system 700, use a quantized neural network when the computing systems do not use an architecture that efficiently supports the transfer and processing of the higher precision data representations.

In some implementations, the memory channels 772A-772D of the computing system 700 performs post training quantization (PTQ) that quantizes one or more data values of one or more layers of the neural network, which requires no validation data. In other implementations, the memory channels 772A-772D of the computing system 700 performs PTQ that quantizes one or more data values with validation data. In either case, the memory channels 772A-772D determine a per-layer optimal precision for data values. The memory channels 772A-772D determine corresponding scaling factors and zero-point values that are used to quantize the one or more data values of one or more layers of the neural network.

In yet other implementations, the memory channels 772A-772D of the computing system 700 performs quantization aware training (QAT) that includes the memory channels 772A-772D performing quantization operations during forward pass propagation of the neural network, but the memory channels 772A-772D provide dequantized (non-quantized) data values during the back pass propagation of the neural network. During the forward pass propagation of the neural network, data values of the layers are quantized by the memory channels 772A-772D. After the forward pass propagation has completed, the output data values of each layer are dequantized by the memory channels 772A-772D. The dequantized values are used in the back propagation pass of the neural network to update the dequantized data values. The process is repeated until a required metric is satisfied such as one of an accuracy threshold value, a threshold number of training epochs, and so forth.

Once a neural network has quantized data values, this neural network is ready to be used for inference by the processor die 750 or another processor die. This quantized neural network uses quantized data values, so any dequantized data values are quantized by the memory channels 772A-772D. The output values of this quantized neural network are often dequantized by the memory channels 772A-772D, since later data processing circuitry uses the higher precision of the dequantized data values. The input data values typically have a higher precision of dequantized data values, so the memory channels 772A-772D dequantizes these input data values. In contrast, the inference output values are preferably represented with a high precision, so the memory channels 772A-772D perform the dequantization operation for these output data values. Typically, the next stage of the application that utilizes the quantized neural network uses the higher precision of the dequantized output data values. Using the functionality provided by the memory channels 772A-772D, memory bound computations are offloaded from the processor die 750 or another processor to the circuitry of the memory channels 772A-772D.

In some implementations, the operating system (OS) kernel includes an application programming interface (API) that supports allocation of particular memory regions of the memory channels 772A-772D that identified to store data values that can be dynamically quantized and dequantized. In an implementation, the operating system marks particular pages of memory with a flag that indicates these pages store data values that can be quantized. User programs with commands stored in a register file, such as the CRF 130 of FIG. 1), use the OS API to allocate memory that stores data values that can be quantized. The API directs the processor die 750 or another processor to translate load operations and store operations of a processor to PIM commands that perform quantized load operations, quantized read operations, a dequantized read operations, dequantized store operations, and dequantized write operations.

The host processor, such as the processor die 750, still communicates with the memory channels 772A-772D at a granularity of cache lines. The host processor executing an application can still perform pointer arithmetic. However, the pointer operations correspond to quantized data provided by the memory channels 772A-772D. In some implementations, the offloading of quantization operations and dequantization operations from the host processor, such as the processor die 750, to the memory channels 772A-772D is done when the data values are not stored in a cache memory subsystem of the host processor. Performance counters that provide the currently used memory bandwidth can be used to indicate whether an accurate estimation can be obtained of the data locality of data values to be used in quantization operations and dequantization operations.

In addition, other conditions provide a similar estimation such as probe filter hit ratios which indicate the presence of on-die copies of the corresponding data values, asserted dirty-bits in the page table entries (PTEs) looked up during address translation, on-die data cache hit ratios, and so forth. Additionally, the benefits of quantization operations and dequantization operations performed by the memory channels 772A-772D are based on the memory devices that store the corresponding data values. Fragmented memory situations and significantly large page allocation situations can cause some or all of the quantization operations and dequantization operations to be performed by a host processor.

Figure 8:
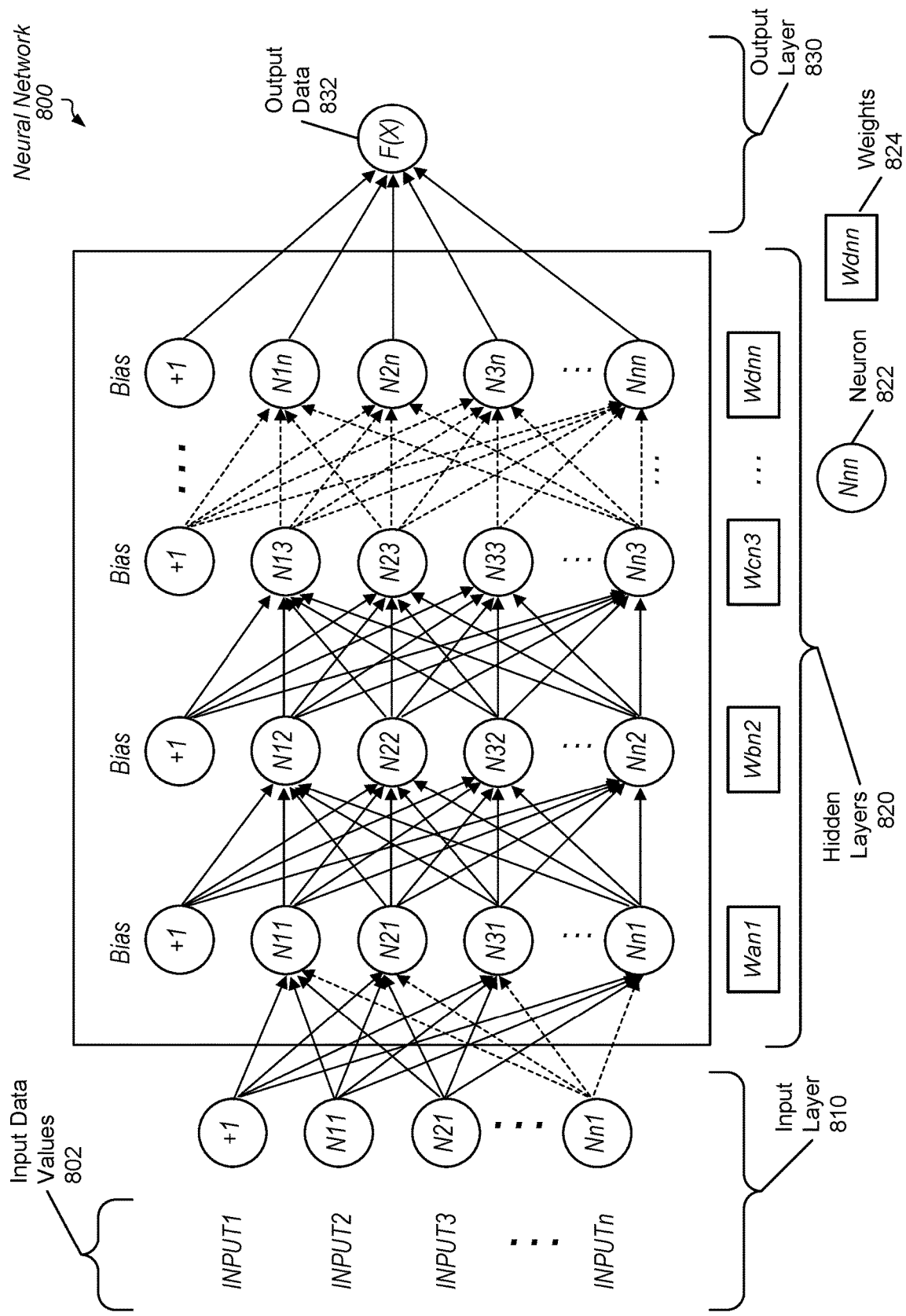
FIG. 8 is a generalized diagram of a neural network that uses less computationally intensive nodes.

Referring to FIG. 8, a generalized diagram is shown of a neural network 800 that includes less computationally intensive nodes. The neural network 800 is a data model that implements one of a variety of types of a neural network. Examples of the types of a neural network are one of multiple types of convolutional neural networks, deep neural networks, and recurrent neural networks. The neural network 800 classifies data in order to provide output data 832 that represents a prediction when given a set of inputs. To do so, the neural network 800 uses an input layer 810, one or more hidden layers 820, and an output layer 830. Each of the layers 810, 820 and 830 includes one or more neurons 822 (or nodes 822). Each of these neurons 822 receives input data such as the input data values 802 in the input layer 810. In the one or more hidden layers 820 and the output layer 830, each of the neurons 822 receives input data as output data from one or more neurons 822 of a previous layer. These neurons 822 also receive one or more weight values 824 that are combined with corresponding input data.

It is noted that in some implementations, the neural network 800 includes only a single layer, rather than multiple layers. Such single-layer neural networks are capable of performing computations for at least edge computing applications. In other implementations, the neural network 800 has a relatively high number of hidden layers 820, and the neural network 800 is referred to as a deep neural network (DNN). Each of the neurons 822 of the neural network 800 combines a particular received input data value with a particular one of the weight values 824. Typically, the neurons 822 use matrix multiplication, such as General Matrix Multiplication (GEMM) operations, to perform the combining step. Circuitry of a processor (not shown) performs the steps defined in each of the neurons 822 (or nodes 822) of the neural network 800. For example, the hardware, such as circuitry, of the processor performs at least the GEMM operations of the neurons 822. In some implementations, the circuitry of the processor is a data-parallel processor that includes multiple compute circuits, each with multiple lanes of execution that supports a data-parallel microarchitecture for processing workloads.

The input layer 810 includes the input data values 802 for the neural network 800. During training, initial values of these input data values 802 are predetermined values used for training the neural network 800. The bias ("Bias") values represent a difference or shift of the prediction values provided by the neurons 822 from their intended values. A relatively high value for a particular bias indicates that the neural network 800 is assuming more than accurately predicting output values that should align with expected output values. A relatively low value for the particular bias indicates that the neural network 800 is accurately predicting output values that should align with expected output values. The weight values 824 indicate an amount of influence that a change of a corresponding input data value has on a change of the output data value of the particular neuron. A relatively low weight value indicates a change of a corresponding input data value provides little change of the output value of the particular neuron. In contrast, a relatively high weight value indicates a change of the corresponding input data value provides a significant change of the output value of the particular neuron.

The neurons 822 of the hidden layers 820, other than a last hidden layer, are not directly connected to the output layer 830. Each of the neurons 822 has a specified activation function such as a step function, which determines whether a corresponding neuron will be activated. An example of the activation function is the rectified linear unit (ReLU) activation function, which is a piecewise linear function used to transform a weighted sum of the received input values into the activation of a corresponding one of the neurons 822. When activated, the corresponding neuron generates a non-zero value, and when not activated, the corresponding neuron generates a zero value.

The activation function of a corresponding one of the neurons 822 receives the output of a matrix multiply and accumulate (MAC) operation. This MAC operation of a particular neuron of the neurons 822 combines each of the received multiple input data values with a corresponding one of multiple weight values of the weight values 824. The number of accumulations, which can be represented by K, performed in the particular neuron before sending an output value to an activation function can be a relatively high number. Here, K is a positive, non-zero integer that is a relatively high value.

In some implementations, a designer uses an application programming interface (API) to specify multiple characterizing parameters of the neural network 800. Examples of these parameters are a number of input data values 802 for the input layer 810, an initial set of weight values for the weight values 824, a number of layers of the hidden layers 820, a number of neurons 822 for each of the hidden layers 820, an indication of an activation function to use in each of the hidden layers 820, a loss function to use to measure the effectiveness of the mapping between the input data values 802 and the output data 832, and so on. In some implementations, different layers of the hidden layers 820 use different activation functions.

The training process of the neural network 800 is an iterative process that finds a set of values for the weight values 824 used for mapping the input data values 802 received by the input layer 810 to the output data 832. The specified loss function evaluates the current set of values for the weight values 824. One or more of forward propagation and backward propagation used with or without gradient descent is used to minimize the cost function by inspecting changes in the bias, the previous activation function results, and the current set of values for the weight values 824.

To create less computationally intensive neurons 822 for the neural network 800, the circuitry of a processor determines whether quantization is used during later inference. In some implementations, a memory using a PIM accelerator in a memory channel replaces the floating-point versions of the input data values 802 with smaller fixed-point (integer) versions of the input data values 802. Rather than have a processor perform the quantization operation, the memory channel has the functionality of the memory channel 110 with memory array banks 120A-120I, each with components of a PIM accelerator and a scatter and gather circuit 170 (of FIG. 1). For example, the memory bank replaces a 32-bit floating-point input data value with an 8-bit fixed-point input data value to be used in an integer matrix multiply and accumulate (MAC) operation of a corresponding one of the neurons 822.

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g., synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g., Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high-level programming language such as C, or a design language (HDL) such as Verilog, VHDL, or database format such as GDS II stream format (GDSII). In some cases, the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware-based type emulator from such vendors as Cadence®, EVER, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus comprising:
   circuitry configured to:
   store, in a given row of a memory array comprising a plurality of rows, a first data value having a first magnitude using a first precision;
   receive a first read access request targeting the first data value, retrieve at least the first data value from the given row;
replace the first magnitude of the first data value with a second magnitude of the first data value using a second precision less than the first precision; and
send the first data value having the second magnitude to a requester that generated the first read access request, in response to the first read access request being a quantized read access.

2. The apparatus as recited in claim 1, wherein the circuitry is further configured to perform a quantization operation on the first data value to replace the first magnitude of the first data value with the second magnitude of the first data value.

3. The apparatus as recited in claim 2, wherein the circuitry is further configured to maintain a single copy of the first data value in the memory array.

4. The apparatus as recited in claim 2, wherein the circuitry is further configured to maintain a buffer with a size less than the given row configured to store data of a plurality of data values to be either quantized or dequantized based on a type of an access request.

5. The apparatus as recited in claim 2, wherein the apparatus is a processing-in-memory (PIM).

6. The apparatus as recited in claim 5, wherein the apparatus further comprises a register file, wherein the circuitry is further configured to:
receive a second read access request targeting the first data value;
retrieve at least the first data value from the given row;
replace the first magnitude of the first data value with the second magnitude of the first data value; and
store the first data value in the register file, in response to the second read access request being a quantized load access.

7. The apparatus as recited in claim 5, wherein the circuitry is further configured to:
receive a write access request targeting the first data value, wherein the write access request comprises a third data value having a third magnitude using a third precision less than the first precision;
replace the third magnitude of the third data value with a fourth magnitude of the third data value using the first precision; and
update the first data value in the given row with the third data value having the fourth magnitude using the first precision.

8. A method, comprising:
generating access requests by one or more requesters;
storing, in a given row of a memory array comprising a plurality of rows, a first data value having a first magnitude using a first precision;
receiving, by circuitry from a given requester of the one or more requesters, a first read access request targeting the first data value;
retrieving, by the circuitry, at least the first data value from the given row;
replacing, by the circuitry, the first magnitude of the first data value with a second magnitude of the first data value using a second precision less than the first precision; and
sending, by the circuitry, the first data value having the second magnitude to the given requester, in response to the first read access request being a quantized read access.

9. The method as recited in claim 8, further comprising performing, by the circuitry, a quantization operation on the first data value to replace the first magnitude of the first data value with the second magnitude of the first data value.

10. The method as recited in claim 9, further comprising maintaining, by the memory array, a single copy of the first data value.

11. The method as recited in claim 9, further comprising maintaining, by the circuitry, a buffer with a size less than the given row configured to store data of a plurality of data values to be either quantized or dequantized based on a type of an access request.

12. The method as recited in claim 9, wherein the memory array is a processing-in-memory (PIM).

13. The method as recited in claim 12, further comprising:
receiving a second read access request targeting the first data value;
retrieving at least the first data value from the given row;
replacing the first magnitude of the first data value with the second magnitude of the first data value; and
storing the first data value in a register file, in response to the second read access request being a quantized load access.

14. The method as recited in claim 12, further comprising:
receiving a write access request targeting the first data value, wherein the write access request comprises a third data value having a third magnitude using a third precision less than the first precision;
replacing the third magnitude of the third data value with a fourth magnitude of the third data value using the first precision; and
updating the first data value in the given row with the third data value having the fourth magnitude using the first precision.

15. A computing system comprising:
one or more requesters, each configured to generate access requests; and
a memory comprising:
a memory array comprising circuitry configured to store data in a plurality of rows including a first data value having a first magnitude using a first precision in a given row of the plurality of rows; and
circuitry configured to:
receive, from a given requester of the one or more requesters, a first read access request targeting the first data value;
retrieve at least the first data value from the given row;
replace the first magnitude of the first data value with a second magnitude of the first data value using a second precision less than the first precision; and
send the first data value having the second magnitude to the given requester, in response to the first read access request being a quantized read access.

16. The computing system as recited in claim 15, wherein the circuitry is further configured to perform a quantization operation on the first data value to replace the first magnitude of the first data value with the second magnitude of the first data value.

17. The computing system as recited in claim 16, wherein the memory array is further configured to maintain a single copy of the first data value.

18. The computing system as recited in claim 16, wherein the circuitry is further configured to maintain a buffer with a size less than the given row configured to store data of a plurality of data values to be either quantized or dequantized based on a type of an access request.

19. The computing system as recited in claim 16, wherein the memory is a processing-in-memory (PIM).

20. The computing system as recited in claim 19, wherein the memory further comprises a register file, wherein the circuitry is further configured to:
  receive a second read access request targeting the first data value from the given requester;
  retrieve at least the first data value from the given row;
  replace the first magnitude of the first data value with the second magnitude of the first data value; and
  store the first data value in the register file, in response to the second read access request being a quantized load access.

\* \* \* \* \*